(12) United States Patent
Negley

(10) Patent No.: US 7,439,609 B2
(45) Date of Patent: Oct. 21, 2008

(54) DOPING OF GALLIUM NITRIDE BY SOLID SOURCE DIFFUSION AND RESULTING GALLIUM NITRIDE STRUCTURES

(75) Inventor: Gerald H. Negley, Carrboro, NC (US)

(73) Assignee: Cree, Inc., Durham, NC (US)

(*) Notice: Subject to any disclaimer, the term of this patent is extended or adjusted under 35 U.S.C. 154(b) by 130 days.

(21) Appl. No.: 10/811,752

(22) Filed: Mar. 29, 2004

(65) Prior Publication Data
US 2005/0211999 A1    Sep. 29, 2005

(51) Int. Cl.
*H01L 33/00*    (2006.01)
*H01L 21/385*    (2006.01)

(52) U.S. Cl. .................. 257/615; 257/79; 257/102; 257/E21.142; 257/E21.152; 257/E21.144

(58) Field of Classification Search ............ 257/E21.15, 257/E21.153, E21.125, E21.135, E21.14–E21.142, 257/E21.144, E21.152, 79, 99, 102, 615, 257/E33.063, E29.144; 438/558, 559, 563
See application file for complete search history.

(56) References Cited

U.S. PATENT DOCUMENTS

| 3,925,121 | A | * | 12/1975 | Touchy ....................... 438/554 |
|---|---|---|---|---|
| 4,188,710 | A | | 2/1980 | Davey et al. |
| 4,796,082 | A | | 1/1989 | Murakami et al. |
| 5,210,051 | A | | 5/1993 | Carter, Jr. |
| 5,306,662 | A | | 4/1994 | Nakamura et al. |
| 5,374,589 | A | | 12/1994 | Roush et al. |
| 5,393,993 | A | | 2/1995 | Edmond et al. |
| 5,468,678 | A | | 11/1995 | Nakamura et al. |
| 5,523,589 | A | | 6/1996 | Edmond et al. |
| 5,592,501 | A | | 1/1997 | Edmond et al. |
| 5,700,714 | A | * | 12/1997 | Ogihara et al. ............... 438/559 |
| 5,739,554 | A | | 4/1998 | Edmond et al. |
| 5,838,706 | A | | 11/1998 | Edmond et al. |
| 6,120,600 | A | | 9/2000 | Edmond et al. |
| 6,187,606 | B1 | | 2/2001 | Edmond et al. |
| 6,201,262 | B1 | * | 3/2001 | Edmond et al. ............... 257/77 |
| 6,214,708 | B1 | * | 4/2001 | Iguchi et al. ................. 438/566 |
| 6,291,328 | B1 | * | 9/2001 | Nobori et al. ................ 438/561 |
| 6,316,793 | B1 | | 11/2001 | Sheppard et al. |
| 6,373,077 | B1 | | 4/2002 | Edmond et al. |
| 6,549,552 | B1 | * | 4/2003 | Omi et al. ................. 372/45.01 |

\* cited by examiner

*Primary Examiner*—Matthew C Landau
(74) *Attorney, Agent, or Firm*—Summa, Allan & Additon, P.A.

(57) ABSTRACT

An improved p-type gallium nitride-based semiconductor device is disclosed. The device includes a structure with at least one p-type Group III nitride layer that includes some gallium, a first silicon dioxide layer on the p-type layer, a layer of a Group II metal source composition on the first $SiO_2$ layer, and a second $SiO_2$ layer on the Group II metal source composition layer.

2 Claims, 4 Drawing Sheets

DOPING OF GALLIUM NITRIDE BY SOLID SOURCE DIFFUSION AND RESULTING GALLIUM NITRIDE STRUCTURES

BACKGROUND OF THE INVENTION

The present invention relates to electronic structures in Group III nitrides, and in particular relates to an improved structure for gallium nitride (GaN) based devices, particularly light emitting diodes (LEDS).

Gallium nitride and the related binary, ternary, and quaternary Group III nitride compounds have become wide bandgap materials of choice for light emitting diodes (including diodes that emit in the green, blue, and ultra-violet portions of the spectrum). In addition to their characteristic wide bandgaps, which permit UV transitions as well as those in the high energy blue and green portions of the visible spectrum, the Group III nitrides are direct emitters; i.e., the recombinations that generate photons avoid losing energy to vibrational transitions during the quantum event. As a result, Group III nitride-based devices can provide an efficiency advantage over those formed in other wide bandgap materials such as silicon carbide (SiC).

As well recognized by those of ordinary skill in this art, the term "diode" refers to a device (in this case a light-emitting device) that has adjacent n-type and p-type portions that define a p-n junction or its functional equivalent. Under an applied potential difference (voltage), current can flow across the junction to generate the recombinations of holes and electrons that in turn generate the photons. Accordingly, light-emitting diodes that incorporate Group III nitrides must incorporate, in most circumstances, both n-type layers of the nitride and p-type layers of the same or a different nitride. Junctions or their equivalent between identical Group III nitrides (e.g., p-type GaN and n-type GaN) are generally referred to as homojunctions, while those between two different nitrides (e.g., GaN and AlGaN) are referred to as heterojunctions. When a three-layer structure includes three different types of Group III materials, they are referred to as double heterojunctions. Other structures useful in diodes include multiple quantum wells as well as superlattices. All of these structures are well understood in this art. Exemplary patents and applications describing the basics of these devices as well as particular features include, for example, commonly-assigned U.S. Pat. Nos. 6,201,262; 6,187,606; 6,120,600, 5,838,706; 5,739,554; 5,592,501; 5,393,993 and 5,210,051.

As an understanding of Group III nitride devices has developed, it has generally been the case that the p-type layers have been more difficult to activate than are the n-type layers. As used herein and as well understood by those in this art, the terms "activate" or "activation," refer to the characteristic of dopant atoms in a crystal in which they can functionally affect the electronic aspects of the device. Stated differently, if dopant atoms (such as magnesium, which acts as a p-type dopant in Group III nitrides) are physically present in the gallium nitride, but not located properly within the crystal structure (typically interstitially rather than in lattice positions), they will behave (at least electronically) as if they were simply absent. For example, a p-type Group III nitride layer with an activated concentration of magnesium of $1 \times 10^{17}$ $cm^{-3}$ may have a total concentration of magnesium atoms of $1 \times 10^{20}$ $cm^{-3}$.

Thus, one of the steps generally required in the production of semiconductor materials and devices, including Group III nitride devices, is to build or treat the device or structure in such a way that the desired number of dopant atoms become activated.

As noted above, such activation has been difficult for magnesium in p-type Group III nitrides, particular GaN. For example, relatively early patents in this field to Nakamura, Nos. 5,468,678 and 5,306,662, describe a step of annealing a p-type layer to attempt to reach the proper activation. Various hypotheses have been forwarded to explain this scenario, many of which assume that magnesium (Mg) is easily bound to hydrogen (H) and thus prevented from becoming activated in p-GaN. Thus, the annealing step has been assumed to serve the purpose of dissociating hydrogen from magnesium and thus allowing the magnesium to become activated (e.g., Column 8, lines 13-36 of No. 5,306,662).

More recently, however, device performance has indicated that the annealing step, standing alone, may not always create activation in the manner intended or previously hypothesized.

Conventionally, the LED structure is formed by starting with a silicon carbide substrate, and then adding an appropriate buffer layer. Epitaxial layers of n-type gallium nitride and p-type gallium nitride, or appropriate Group III nitride multiple quantum wells (MQW's) are added on the buffer to form the active portion of the device. Then, silicon dioxide is added to the active layer or layers to protect the p-type gallium nitride layer during further processing steps, many of which include heating the structure.

As part of the development of these devices, it was determined and decided to avoid the use of nickel for the necessary ohmic contacts in order to (among other reasons) permit lower temperatures to be used during other steps. Higher-temperature process steps can negatively affect gallium nitride, which has a dissociation temperature of about 1250° C. In this regard, an ohmic contact can be formed (and potentially annealed) at lower temperatures by using a silicon carbide (an advantageous substrate material for Group III nitride devices) substrate implanted with additional doping on the contact side. This technique is set forth in commonly assigned U.S. Pat. Nos. 5,409,859 and 5,323,022, the contents of which are incorporated entirely herein by reference.

Accordingly, success in formic ohmic contacts with these lower temperature processes encouraged the elimination of the silicon dioxide step as no longer being necessary to protect the GaN (or other Group III nitride) layers from exposure to high temperatures. Eliminating a theoretically unnecessary process step is, of course, entirely consistent with conventional engineering thought in that using fewer steps and lower temperatures should be advantageous for the process and the end device.

GaN-based LEDs formed in this manner appeared to be satisfactory until a protective layer of silicon nitride was added for passivation purposes as the last protective layer. In such devices, the forward voltage would increase dramatically and undesirably. Although higher voltage can be desirable in some cases, a forward voltage that is excessive with respect to a particular material or structure can overheat and damage or destroy devices such as LEDs.

From a positive empirical standpoint, devices made using the silicon dioxide layer step exhibited higher effective doping activation than those devices made without the $SiO_2$ layer.

Accordingly, a need exists for a better understanding of the function of the anneal and of activation in p-type Group III nitrides, particularly gallium nitride, and for improving the manufacture and structure of p-type Group III nitride and GaN layers in such devices.

SUMMARY OF THE INVENTION

The invention meets this object with an improved p-type gallium nitride based semi-conductor device comprising a device structure that includes at least one p-type Group III nitride layer that includes some gallium, a first silicon dioxide layer on the p-type layer, a layer of a Group II metal source composition on the first silicon dioxide layer, and a second silicon dioxide layer on the Group II metal layer.

In another aspect, the invention comprises an improved p-type gallium nitride based device comprising a conductive silicon carbide substrate, a conductive buffer layer on the substrate for providing a crystal transition between the substrate and the gallium nitride portions of the device and an n-type gallium nitride layer on the buffer layer, a p-type gallium nitride layer on the n-type layer, a first silicon dioxide layer on the p-type layer, a magnesium layer on the first silicon dioxide layer for supplying p-type dopant atoms to said p-type layer, and a second silicon dioxide layer on the magnesium layer for passivating the device. The first silicon dioxide layer is thick enough to create vacancies to a required depth in the p-type gallium nitride layer when the device is heated to temperatures between about 750° and 950° C. while still permitting diffusion from the magnesium layer through the first silicon dioxide layer and into the p-type gallium nitride layer at such temperatures. The second $SiO_2$ layer (on the metal layer) helps to prevent the metal (or metal source) layer from evaporating during the diffusion step.

In another aspect, the invention is a method of activating the p-type layers and passivating a Group III nitride device by thermally annealing a structure that includes at least one p-type Group III nitride layer that includes some gallium, a first silicon dioxide layer on the p-type layer, a layer of a Group II metal source composition on the first silicon dioxide layer, and a second silicon dioxide layer on the Group II metal layer.

In another aspect, the invention is a method of increasing the activation of a p-type Group III nitride layer that includes some gallium nitride by forming a first layer of silicon dioxide on the p-type layer, forming a layer of a Group III metal source composition on the first silicon dioxide layer, forming a second layer of silicon dioxide on the metal layer, and annealing the structure to diffuse the metal from the metal layer into the p-type gallium containing layer and to activate metal atoms in the p-type layer.

In yet another aspect, the invention is a method of creating a p-type layer from a nominally n-type gallium nitride layer by forming a first layer of silicon dioxide on the nominally n-type gallium nitride layer, forming a layer of magnesium on the first silicon dioxide layer, forming a second layer of silicon dioxide on the magnesium layer, and then annealing the structure to diffuse magnesium from the magnesium layer into the nominally n-type gallium nitride layer and activate sufficient magnesium in the layer to produce p-type characteristics.

In a further aspect, the invention is a method of creating a p-type layer from a nominally n-type gallium nitride layer by annealing the gallium nitride layer in the presence of an adjacent silicon dioxide layer, a layer of a Group II metal source composition on the adjacent silicon dioxide layer, and a second silicon dioxide layer on the metal layer, until the gallium nitride layer demonstrates p-type characteristics.

These and other objects and advantages of the invention will be clearly understood with respect to the following drawings and detailed description.

DETAILED DESCRIPTION

The present invention is a method of activating p-type layers in Group III nitride devices and the resulting devices and device precursors.

Figure 1:
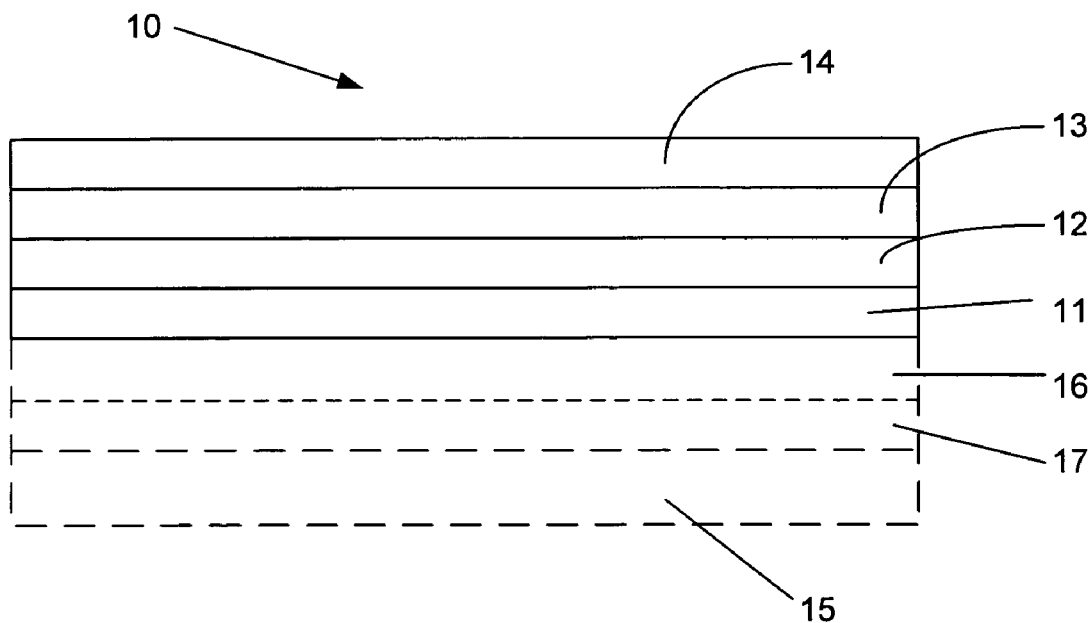
FIG. 1 is a cross-sectional view of the basic elements of the present invention.

FIG. 1 is a cross-sectional view of a device precursor broadly designated at 10. The device precursor 10 includes at least several common elements. These include at least one p-type Group III-nitride layer 11 that includes gallium. A first silicon dioxide layer 12 is positioned on the p-type layer. A Group II metal layer 13 is on the first silicon dioxide layer 12 and is preferably selected from the group consisting of magnesium and zinc, with magnesium being most preferred. A second silicon dioxide layer 14 is on the metal layer 13.

As an alternative to the Group II metal layer, the invention can also incorporate a Group II metal source composition; i.e., typically a compound that contains a Group II metal and from which the Group II metal can diffuse in accordance with the description herein. Presently preferred source compositions include magnesium nitride ($Mg_3N_2$) and zinc phosphide ($Zn_3P_2$). The option of using a metal or a metal-containing composition is appropriate for all of the embodiments described herein.

Similarly, although the silicon dioxide layers (12, 14) are typically and preferably stoichiometric (i.e., $SiO_2$), the stoichiometry is not fundamental to their function and thus non-stoichiometric layers can serve the same purpose.

In most circumstances, the structure 10 will include a number of additional elements. These typically include the substrate 15, which in the present invention is preferably formed of silicon carbide. Silicon carbide offers a number of advantages for devices of this type, one of which is capable of being conductively doped and thus being able to support "vertical" device structures; i.e., those in which the anode and cathode ohmic contacts can be placed axially opposite one another at opposite ends of the device. Silicon carbide also has a number of advantageous electronic and physical properties that are well-known and well-established in this art. For a number of reasons, the SiC substrate is preferably a single crystal structure (potentially including SiC epitaxial layers) and has a polytype selected from the group consisting of the 3C, 4H, 6H, and 15R polytypes of SiC.

The device structure also includes an n-type Group III nitride layer 16 typically adjacent to p-type layer 11, and thus forming a p-n-junction in the overall device for the current injection and recombination purposes that generate the desired photons.

Because of the differences in crystal structure between the silicon carbide substrate and the Group III nitride layers, a structure such as the one illustrated at 10 generally includes some sort of buffer layer 17 between the silicon carbide substrate and the Group III nitride layers.

The metal layer 13 can also be a metal source layer rather than a pure metal. Exemplary source compositions include magnesium nitride ($Mg_3N_2$) and zinc phosphide ($Zn_3P_2$).

In its broadest aspects, the method of the invention comprises activating the p-type layer 11 by thermally annealing the elements of the structure 10 illustrated in FIG. 1. The annealing is carried out at a temperature and for a time sufficient to activate or increase the activation of the p-type layer 11. In preferred embodiments, the structure 10 is annealed for a time sufficient for the structure 10 to reach a temperature of between about 750° and 950° C., with a temperature of between about 850° C. and 875° C. being most preferred. The time of annealing is not overly critical, but it has generally been found that using conventional (for this act) heating equipment, this annealing should take about 5 minutes. Stated differently, once the device reaches the appropriate annealing temperature, the anneal can be considered complete and there is no need to keep the device at that temperature for an overly-extended period of time. Indeed, those familiar with Group III nitride structures will recognize (as set forth in the Background) that one goal of working with such devices is to minimize the exposure of the Group III nitride layers to excessive temperatures.

The buffer layer 17 is likewise conductive. Appropriate buffer structures for these types of devices are set forth in the art, with exemplary buffers being set forth in U.S. Pat. Nos. 6,373,077; 6,201,262; 6,187,606; 5,838,706; 5,523,589; and 5,3939, 993, which are commonly assigned with the present invention and the contents of which are incorporated entirely herein by reference.

Because the structure is intended to support the annealing step, the first silicon dioxide layer 12 is preferably thick enough to create vacancies to a depth in the p-type layer 11 that encourages atoms of the Group II metal to diffuse from the Group II layer 13 into the p-type layer 11 while still permitting diffusion from the Group II metal layer through the first silicon dioxide layer 12 and into the p-type layer 11. In preferred embodiments, the first silicon dioxide layer is about 1,000 angstroms (Å) thick, the metal layer is 1000 angstroms (Å) thick, and the second silicon dioxide layer 14 is about 2500 angstroms (Å) thick.

The silicon carbide substrate 15 is preferably n-type and has a carrier concentration of between 1E16 and 1E19 ($1 \times 10^{16}$ cm$^{-3}$ and $1 \times 10^{19}$ cm$^{-3}$).

Figure 2:
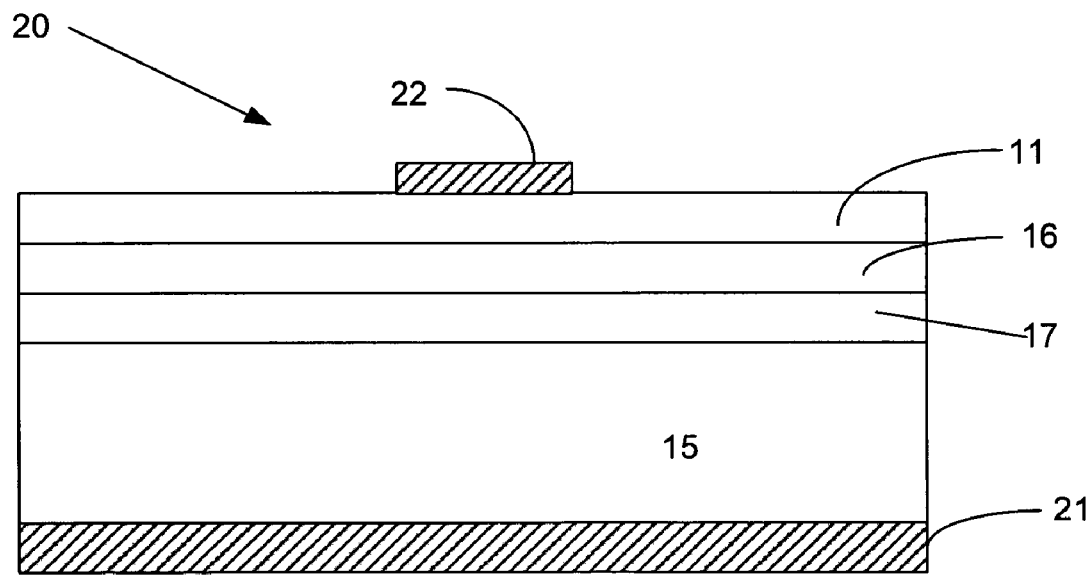
FIG. 2 is a cross-sectional view of a device formed according to the present invention.

FIG. 2 is a cross-sectional schematic view of a device 20 incorporating the activated p-type layer 11 according to the present invention. Common elements are numbered with the same reference numerals as used in FIG. 1. Thus, the device includes the silicon carbide substrate 15, the buffer 17, and the n-type layer 16. The structure is completed with the ohmic contact 21 to the substrate 15 and the ohmic contact 22 to the p-type layer 11.

As is known and recognized by those of ordinary skill in this art, a great deal of additional sophistication can be brought to bear over and above the basic structural elements that are illustrated in FIG. 2. Because these additional elements are not particularly necessary to explain the advantages of the invention, they will not be included herewith in a specific description. The method of the invention, however, is entirely suitable for use with more sophisticated structures. Such structures can include those that use one or more ("multiple") quantum wells as the active layers, or superlattice structures as part of the crystal transition between the SiC substrate and the Group III nitride layers. Such a diode is illustrated for example in copending and commonly assigned application Ser. No. 10/170,577, filed Jun. 12, 2002, the contents of which are incorporated entirely herein by reference.

Additionally, the structure between the ohmic contact 22 and the p-type Group III nitride layer can also include one or more p-type contact layers that enhance the flow of current from the junction and the p-type layer to the ohmic contact 22.

As FIG. 2 illustrates, in the final device 20 the first and second silicon dioxide layers 12 and 14 and the metal layer 13 are no longer present. In reaching the structure of FIG. 2 from the precursor of FIG. 1, these silicon dioxide layers 12 and 14 and the metal layer 13 are removed prior to depositing the ohmic contact 22, preferably by an appropriate etch. Appropriate etchants for silicon dioxide include hydrogen fluoride, BOE or fluorine-based dry etchants, and for Group II metals such as magnesium or zinc include mineral acids such as sulfuric ($H_2PO_4$) or nitric ($HNO_3$) or combinations thereof. The etching steps are otherwise conventional in the art and will not be discussed in detail herein.

Accordingly, in a preferred embodiment, the device precursor structure 10 includes the conductive silicon carbide substrate 15, the conductive buffer layer 17 on the silicon carbide substrate 15 for providing a crystal transition between the substrate 15 and the gallium nitride portions of the device 10, an n-type gallium nitride layer 16 on the buffer layer 17, a p-type gallium nitride layer 11 on the n-type layer 16, a first silicon dioxide layer 12 on the p-type layer 11, a magnesium layer 13 on the first silicon dioxide layer 12 for supplying p-type dopant atoms to the p-type layer 11, and a second silicon dioxide layer 14 on the magnesium layer 13 for passivating the device precursor structure 10. The first silicon dioxide layer 12 is thick enough to create vacancies to a required depth in the p-gallium nitride layer 11 when the device 10 is heated to temperatures between about 750° and 950° C. while still permitting diffusion from the magnesium layer 13 through the first silicon dioxide layer 12 and into the p-type layer 11 at those temperatures.

In a most preferred embodiment, the silicon carbide substrate 15 is n-type and has a carrier concentration of between about 1E16 and about 1E19. The buffer 17 is preferably selected from the group consisting of graded layers of Group III nitrides, homogeneous layers of Group III nitrides, heterogeneous layers of Group III nitrides, and combinations thereof.

The n-type layer 16 can compromise a selected Group III nitride having the formula $Al_xIn_yGa_{1-x-y}N$ where $0 \leq x \leq 1$ and $0 \leq y \leq 1$ and does not necessarily need to contain gallium. The p-type layer 11 does, however, contain some gallium in all embodiments, and thus can be best expressed by the formula $Ga_xAl_yIn_{1-x-y}N$ where $0 < x \leq 1$ and $0 \leq y \leq 1$, and preferably is gallium nitride.

In another aspect, the invention can be considered as a method of increasing the activation of a p-type Group III nitride layer that includes some gallium nitride. In this aspect, the method comprises forming a first layer of silicon dioxide on the p-type layer, forming a layer of a metal selecting from the group consisting of magnesium and zinc on the first silicon dioxide layer, forming a second layer of silicon dioxide on the metal layer, and then annealing the structure to diffuse the metal atoms from the metal layer into the p-type gallium-containing layer and to activate those (and potentially other) metal atoms in the p-type layer.

In this aspect, the step of forming the first silicon dioxide layer comprises forming the silicon dioxide layer to a thickness sufficient to create gallium vacancies to a required depth in the p-type layer during the annealing step while still permitting magnesium to diffuse from the metal layer through the first silicon dioxide layer and into activated positions in the p-type layer.

Most preferably, the method comprises annealing the structure at a temperature and for a time sufficient to provide an activated p-type layer of at least about 1E17.

Most preferably, the method comprises forming the silicon dioxide layer to a thickness of about 1000 Å and annealing (thermal cycling) the structure for a time sufficient for the structure to reach a temperature of between about 750°-950° C., most preferably a temperature of between about 850° and 875° C., and for a period of about 5 minutes.

In the most preferred embodiments, the p-type layer is formed of GaN and the metal layer is magnesium. The structure can be completed if desired with a silicon nitride ($Si_3N_y$) cap on the structure, which can be deposited by any appropriate method including plasma enhanced chemical vapor deposition (PECVD).

In yet another aspect, the invention is a method of creating a p-type layer from a nominally n-gallium nitride layer. In this aspect, the method comprises annealing the gallium nitride layer in the presence of an adjacent silicon dioxide layer, a Group II metal layer on the adjacent silicon dioxide layer and a second silicon dioxide layer on the metal layer until the gallium nitride layer demonstrates p-type characteristics. In general, and if compensation is to be avoided (although sometimes it is desired), the method preferably comprises annealing a gallium nitride layer in this manner in which the gallium nitride layer starts with an n-type carrier concentration of about 5E16 or less. It will thus be understood that if the starting concentration of the n-type layer is greater, the result can be (desirably or undesirably as the case may be) an n-compensated p-type layer.

In order to demonstrate p-type characteristics, the method preferably comprises annealing the gallium nitride layer until the gallium nitride layer demonstrates a p-type carrier concentration of at least about 1E17.

As in the earlier-described embodiments, the method preferably comprises annealing the structure for a time sufficient for the structure to reach a temperature of between about 750° and 950° C., with a temperature of between about 850° and 875° C. being most preferred, for a time period of about five (5) minutes.

Although the inventors do not wish to be bound by any particular theory, it appears that when the silicon dioxide is present, and a device is thermally annealed, an equilibrium or near-equilibrium is created that shifts to encourage gallium atoms to move into the silicon dioxide, leaving gallium vacancies in the gallium nitride layer. These vacancies in turn provide an opportunity for additional interstitial magnesium atoms to move into activated positions.

Accordingly, the structure and method of the present invention provides oxygen that appears to help "getter" hydrogen out of the epitaxial layer. By way of comparison, the Nichia referred to earlier argue that hydrogen bonding to magnesium prevents activation of the magnesium; i.e., reduces the number of magnesium atoms that functionally contribute to the doping.

In contrast, it has been discovered according to the present invention, and again without being bound by any particular theory, that the oxygen in the silicon dioxide appears to help create gallium vacancies in the appropriate gallium nitride layer during the heating steps. It appears that when silicon dioxide is adjacent to a gallium nitride layer during an annealing step, the oxygen reacts with the gallium to form compounds such as $GaO$, $Ga_2O$, and $Ga_2O_3$. The vacancies thus created help provide positions where the interstitial or additional magnesium present (either one) can enter and occupy activated positions and contribute successfully to the doping of the layer.

In this aspect, the method can further comprise the steps of forming the first layer of silicon dioxide on the nominally n-type layer, then forming the layer of metal (preferably magnesium) on the first silicon dioxide layer, then forming the second layer of silicon dioxide on the magnesium layer, all prior to annealing the structure under the described conditions.

Figure 3:
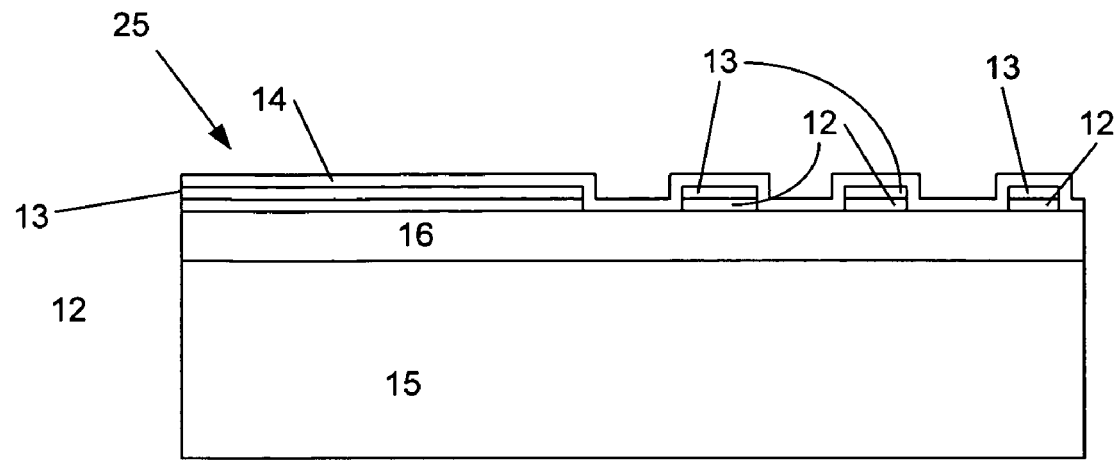
FIG. 3 is a cross-sectional view of a device precursor according to the present invention.
Figure 4:
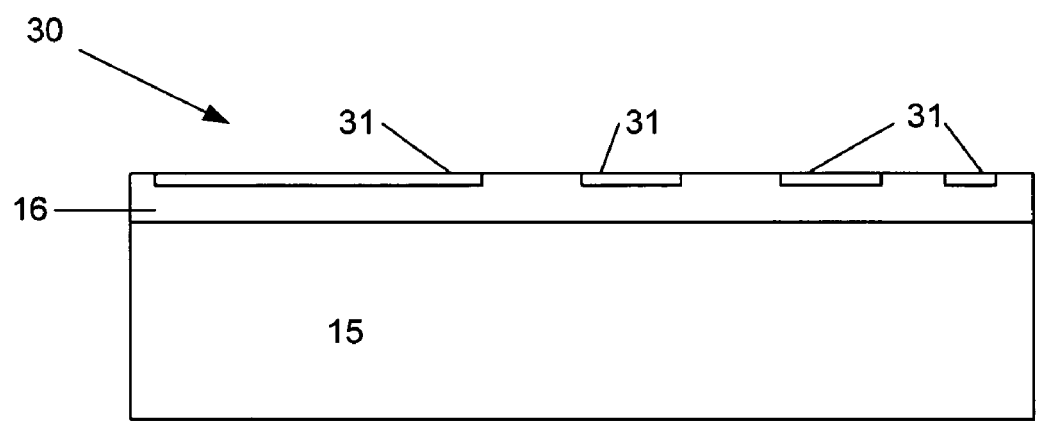
FIG. 4 is a cross-sectional view of another device precursor according to the present invention.

FIGS. 3 and 4 illustrate the matter in which the method of the invention can be used to form the diffused p-type gallium nitride layers, including compensated layers, from n-type gallium nitride layers. FIG. 3 illustrates a device precursor portion in cross-sectional fashion and broadly designated at 25. Using reference numerals consistent with those used in FIGS. 1 and 2, the structure first includes the silicon carbide substrate 15. In order to simplify the drawing somewhat, the transitional buffer layer 17 is not illustrated, but this will be understood as an omission for simplifying the diagram, rather than as any mis-description of the invention. An n-type GaN layer 16 is illustrated on the substrate 15. Portions, but not all, of the n-type layer 16 are covered with the three-part silicon dioxide/metal source/silicon dioxide structure already described to thus form a plurality of such portions. As in the previous illustrations, the first silicon dioxide layers are respectively designated at 12, the metal source layers at 13, and the silicon dioxide cap layer at 14. By covering some, but not all of the n-type layer 16 with the first silicon dioxide layer 12 and metal source layer 13, the areas into which the metal atoms will diffuse are limited to the adjacent regions. In this manner, and using conventional and well-understood masking techniques, the resulting position of p-type gallium nitride or compensated n-type gallium nitride can be proactively designed.

FIG. 4 illustrates the resulting device precursor broadly designated at 30 following the annealing step of the invention as previously described herein. The precursor 30 includes the silicon carbide substrate 15 and the n-type GaN layer 16. FIG. 4 also illustrates, however, that a plurality of portions of p-type GaN (or depending upon the concentration n-type compensated GaN) are present and designated at 31. The invention thus provides a technique for successfully forming these compensated portions 31 as may be desired or necessary in particular devices.

A finished device can be formed from the precursor 30 by adding additional elements such as ohmic contacts in any desired or necessary fashion that is otherwise conventional in the art and that avoids interfering with the desired structure or function of the device.

Figure 5:
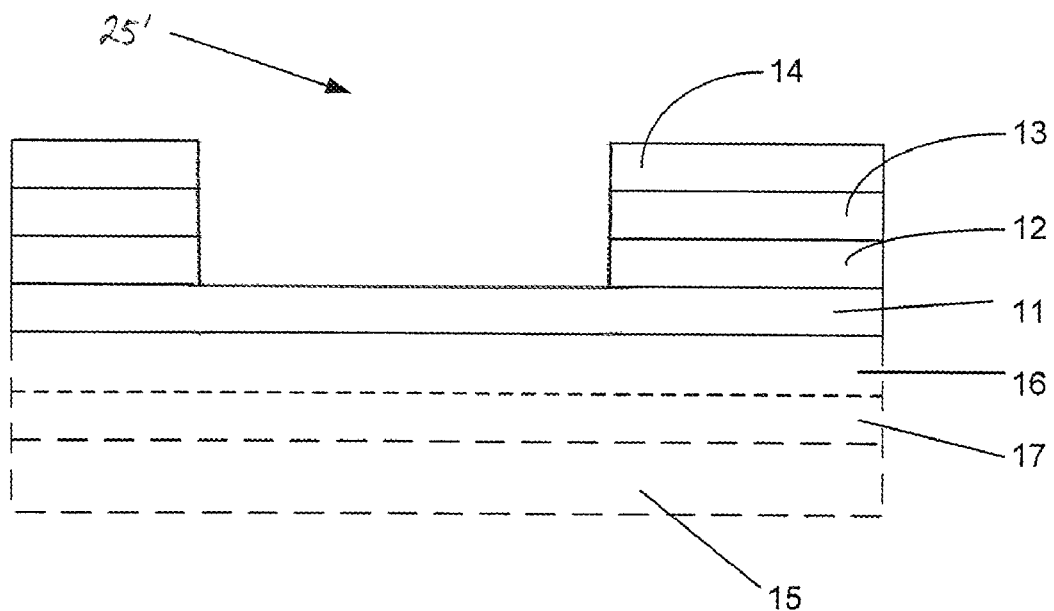
FIG. 5 is a cross sectional view of another device precursor according to the present invention.
Figure 6:
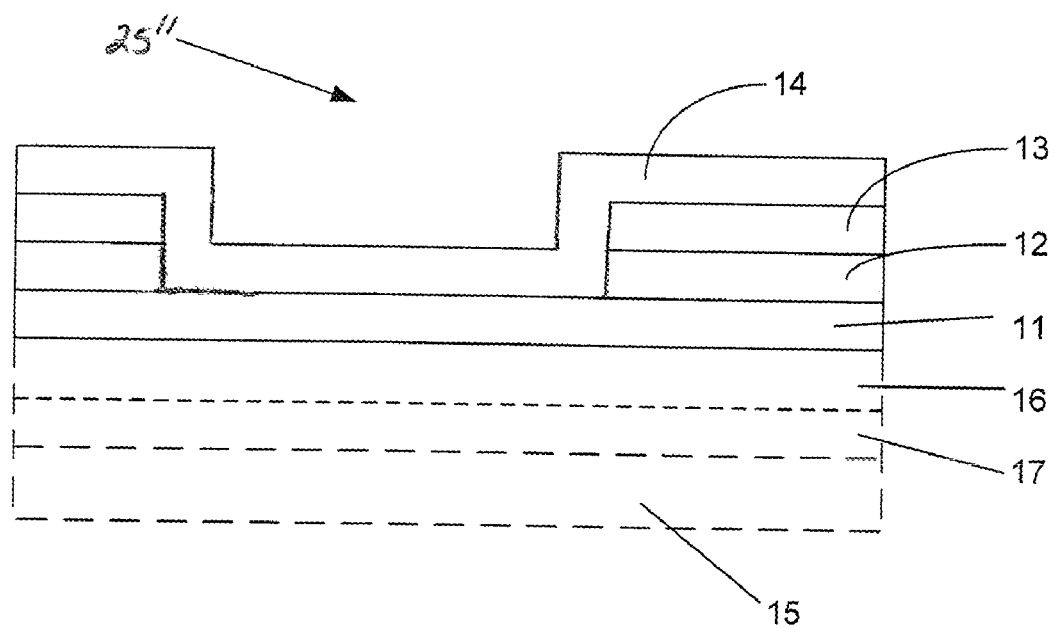
FIG. 6 is a cross sectional view of another device precursor according to the present invention.

FIG. 5 illustrates another device precursor broadly designated at 25' following the annealing step of the invention previously described herein. The precursor 25' includes the silicon carbide substrate 15 and the n-type GaN layer 16. FIG. 5 also illustrates a plurality of portions of silicon dioxide layer 12 on a p-type Group III nitride layer 11. As also illustrated in FIG. 5, device 25' further includes a respective portion of the source composition 13 on each of the silicon dioxide portions 12. FIG. 5 further illustrates an embodiment of the invention in which second silicon dioxide layer 14 is limited to portions of source composition layer 13. FIG. 6 illustrates an alternative embodiment of the device precursor of the invention designated broadly at 25" also following the annealing step of the invention in which second silicon dioxide layer 14 covers the source composition portions 13 and portions of the p-type Group III nitride layer 11.

Figure 7:
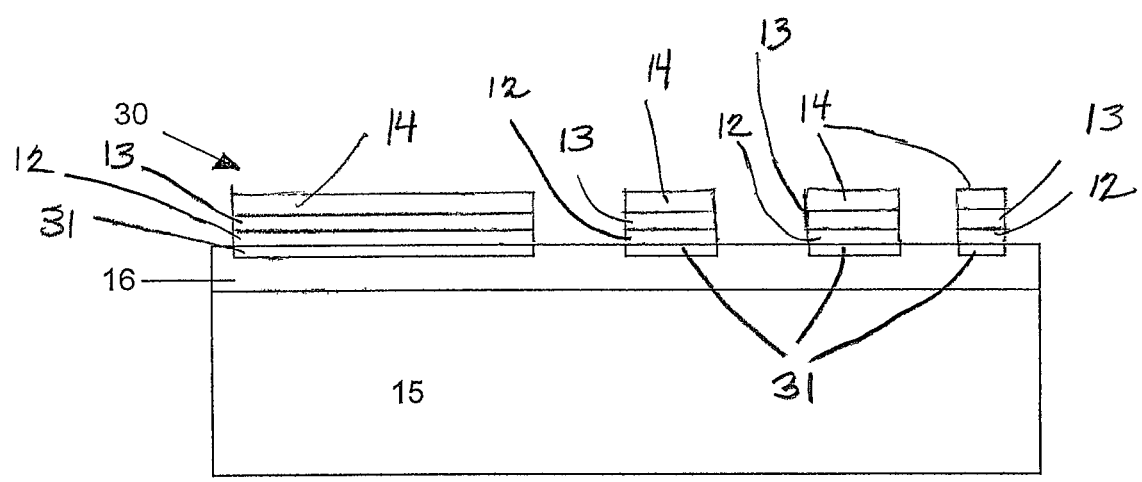
FIG. 7 is a cross sectional view of another device precursor according to the present invention.

FIG. 7 illustrates a device precursor broadly designated at 30' including the silicon carbide substrate 15 and the n-type GaN layer 16. FIG. 7 also illustrates a plurality of portions of p-type GaN (or depending upon the concentration n-type compensated GaN) designated at 31. FIG. 7 also illustrates a plurality of portions of silicon dioxide layer 12 on the portions of the p-type Group III nitride layer 31. As also illustrated in FIG. 7, device 30' further includes a respective portion of the source composition 13 on each of the silicon dioxide portions 12. FIG. 7 further illustrates an embodiment of the invention in which second silicon dioxide layer 14 is limited to portions of source composition layer 13.

In the drawings and specification there have been set forth preferred embodiments of the invention, and although specific terms have been employed, they are used in a generic and descriptive sense only and not for purposes of limitation, the scope of the invention being defined in the claims.

The invention claimed is:

1. An improved p-type gallium nitride-based semiconductor device comprising:
   a device structure that includes at least one p-type Group III nitride layer that includes some gallium;
   a plurality of silicon dioxide portions on said p-type Group III nitride layer;
   a portion of a Group II metal source composition layer on each of said silicon dioxide portions; and
   a second silicon dioxide layer on said Group II metal source composition layer,
   wherein said second silicon dioxide layer is limited to said source composition layer portions.

2. An improved p-type gallium nitride-based semiconductor device comprising:
   a conductive silicon carbide substrate;
   a conductive buffer layer on said silicon carbide substrate for providing a crystal transition between said substrate and Group III nitride portions of said device;
   an n-type Group III nitride layer on said buffer layer;
   a p-type Group III nitride layer that includes some gallium directly on said n-type layer and forms a p-n junction;
   a plurality of silicon dioxide portions on said p-type Group III nitride layer;
   a portion of a magnesium source composition layer on each of said silicon dioxide portions; and
   a second silicon dioxide layer on said magnesium source composition layer,
   wherein said second silicon dioxide layer is limited to said magnesium source composition layer portions.

* * * * *